United States Patent
Theodoras, II

(10) Patent No.: US 7,447,440 B2
(45) Date of Patent: Nov. 4, 2008

(54) MULTIPLE CHANNEL OPTICAL TRANSCEIVER MODULES

(75) Inventor: James T Theodoras, II, Plano, TX (US)

(73) Assignee: Cisco Technology, Inc., San Jose, CA (US)

(*) Notice: Subject to any disclaimer, the term of this patent is extended or adjusted under 35 U.S.C. 154(b) by 529 days.

(21) Appl. No.: 10/847,948

(22) Filed: May 17, 2004

(65) Prior Publication Data
US 2005/0254821 A1    Nov. 17, 2005

(51) Int. Cl.
*H04B 10/00* (2006.01)
(52) U.S. Cl. .................. 398/138; 398/128; 398/139
(58) Field of Classification Search .......... 398/128, 398/135–139, 162–164
See application file for complete search history.

(56) References Cited

U.S. PATENT DOCUMENTS

| | | | |
|---|---|---|---|
| 5,535,034 A | 7/1996 | Taniguchi | |
| 5,712,864 A | 1/1998 | Goldstein et al. | |
| 5,796,899 A | 8/1998 | Butrie et al. | |
| 5,838,859 A | 11/1998 | Butrie et al. | |
| 6,075,635 A | 6/2000 | Butrie et al. | |
| 7,022,080 B2* | 4/2006 | Marian, Jr. | 600/459 |
| 7,184,669 B2* | 2/2007 | Gordon | 398/138 |
| 2001/0030789 A1* | 10/2001 | Jiang et al. | 359/152 |
| 2002/0085254 A1 | 7/2002 | Kurata et al. | |
| 2002/0181058 A1* | 12/2002 | Ger et al. | 359/163 |
| 2003/0039002 A1 | 2/2003 | Toriumi et al. | |
| 2003/0048511 A1 | 3/2003 | Tsumori et al. | |
| 2003/0152338 A1* | 8/2003 | Kuhara et al. | 385/89 |
| 2004/0071413 A1 | 4/2004 | Tsumori | |

* cited by examiner

Primary Examiner—Dzung D Tran
(74) Attorney, Agent, or Firm—Cindy Kaplan

(57) ABSTRACT

Techniques for multiple channel optical transceivers for use in network devices are provided. In general, a row of optical emitters are disposed adjacent to a row of optical detectors in order to provide increased bandwidth and reduced optical crosstalk. Each row can be electrically coupled to an associated transmitting electronic board or detecting electronic board to reduce electronic crosstalk. The configuration of the optical emitters and detectors allow enhanced flexibility in dressing out the optical fibers and routing them to other network devices.

30 Claims, 8 Drawing Sheets

MULTIPLE CHANNEL OPTICAL TRANSCEIVER MODULES

BACKGROUND OF THE INVENTION

The present invention relates to optical transceiver modules. More specifically, the invention relates to optical transceiver modules with multiple channels including a dual row pattern of optical emitters/detectors and separate transmit and detect electronics.

As fiber optics developed, many new technologies emerged to enhance their use. For example, fairly recently, a specification for a new generation of optical modular transceivers was developed named "small form-factor pluggable" (SFP). SFP transceivers are designed to be high bandwidth, small physical size and easily changeable (including being hot-swappable) on the line card of the network device.

Unfortunately, integrated circuit (e.g., application specific integrated circuit or ASIC) densities have increased to the point that line cards are now optical port density limited, rather than switch or processor limited. Thus, the electronics on the motherboards of the line card have the capacity to process more optical information than is being transmitted and received from the optical ports of the line card. This extra capacity is potential bandwidth that is not being realized. As a result, many line cards that use conventional SFP optics strand bandwidth.

There have been many attempts to achieve higher optical port densities. For example, parallel ferrule connectors have been utilized to solve the problem of optical port density on the line card faceplate. However, this typically requires fanout cables that are bulky, expensive and may be unreliable.

Single-mode parallel solutions are available, but they have typically been very large, expensive and difficult to manufacture. Additionally, they may require permanently attached fiber pigtails due to alignment requirements.

As a solution to solve the high cost of these early parallel offerings, the parallel vertical cavity self emitting laser (VCSEL) technology was developed. However, VCSEL technology blossomed at shorter wavelengths (e.g., 850 nm) and enabled only very short multi-mode applications. Also, the majority of VCSEL based parallel optics are designed for parallel data transfer, where all channels of data are synchronous or plesiochronous. These products, therefore, typically do not allow multiple channels that are totally independent (e.g., four independent, serial data channels). Lastly, the reliability of this solution is still questionable.

It would be beneficial to have innovative techniques for providing optical transceiver modules that provides multiple channel optics without the disadvantages normally associated with this capability. Additionally, it would be beneficial if the optical and electrical crosstalk is reduced or eliminated.

SUMMARY OF THE INVENTION

The present invention provides innovative techniques for multiple channel optical transceiver modules for use in network devices. In general, a row of optical emitters (e.g., laser diodes or light emitting diodes (LEDs)) are disposed next to a row of optical detectors (e.g., laser detectors). Each row can be electrically coupled to an associated transmitting electronic board or detecting electronic board within the module.

Advantages include that the fiber cables from the optical transceiver module can be dressed out as multiple pairs or duplexes. Reduced optical crosstalk can be achieved as a result of the separate optical emitter/detector rows. Reduced electrical crosstalk can be achieved through the separate transmitting and detecting electronic boards. As the optical emitters and detectors are in separate rows, fabrication of the bars can made more efficient and with higher yields than hybrid bars. Thus, multiple channel optical transceiver modules can be provided with one or more of these features with the added flexibility. Some specific embodiments of the invention are described below.

In one embodiment, the invention provides an optical transceiver module. The module comprises a row of multiple optical emitters and a row of multiple optical detectors, wherein the row of optical emitters is parallel to the row of optical detectors. In some embodiments, there are four optical emitters and four optical detectors.

In another embodiment, the invention provides an optical transceiver module. The module comprises a transmitting electronic board electrically coupled to an optical emitter for controlling the optical emitter and a receiving electronic board electrically coupled to an optical detector for receiving electrical signals from the optical detectors. The transmitting and receiving electronic boards can be retained in the module in parallel.

In another embodiment, the invention provides an optical transceiver module. The module comprises a row of four optical emitters; a transmitting electronic board electrically coupled to the row of optical emitters for controlling the optical emitters; a row of four optical detectors, wherein the row of optical emitters is parallel to the row of optical detectors; and a receiving electronic board electrically coupled to the row of optical detectors for receiving electrical signals from the optical detectors Other features and advantages of the invention will become readily apparent upon review of the following description in association with the accompanying drawings, where the same or similar structures are designated with the same reference numerals.

BRIEF DESCRIPTION OF THE DRAWINGS

FIGS. 5A and 4B show an example of a cable that can be connected to a parallel optical transceiver of the invention.

DETAILED DESCRIPTION OF EMBODIMENTS

In the description that follows, the present invention will be described in reference to embodiments that are used in association with multiple channel optical transceivers for use with line cards of network devices. However, embodiments of the invention are not limited to any particular version, protocol, environment, application, or implementation. For example, although embodiments of the invention will be described in reference to specific embodiments, the invention can be advantageously applied to many embodiments. Therefore, the description of the embodiments that follows is for purposes of illustration and not limitation.

Figure 1:
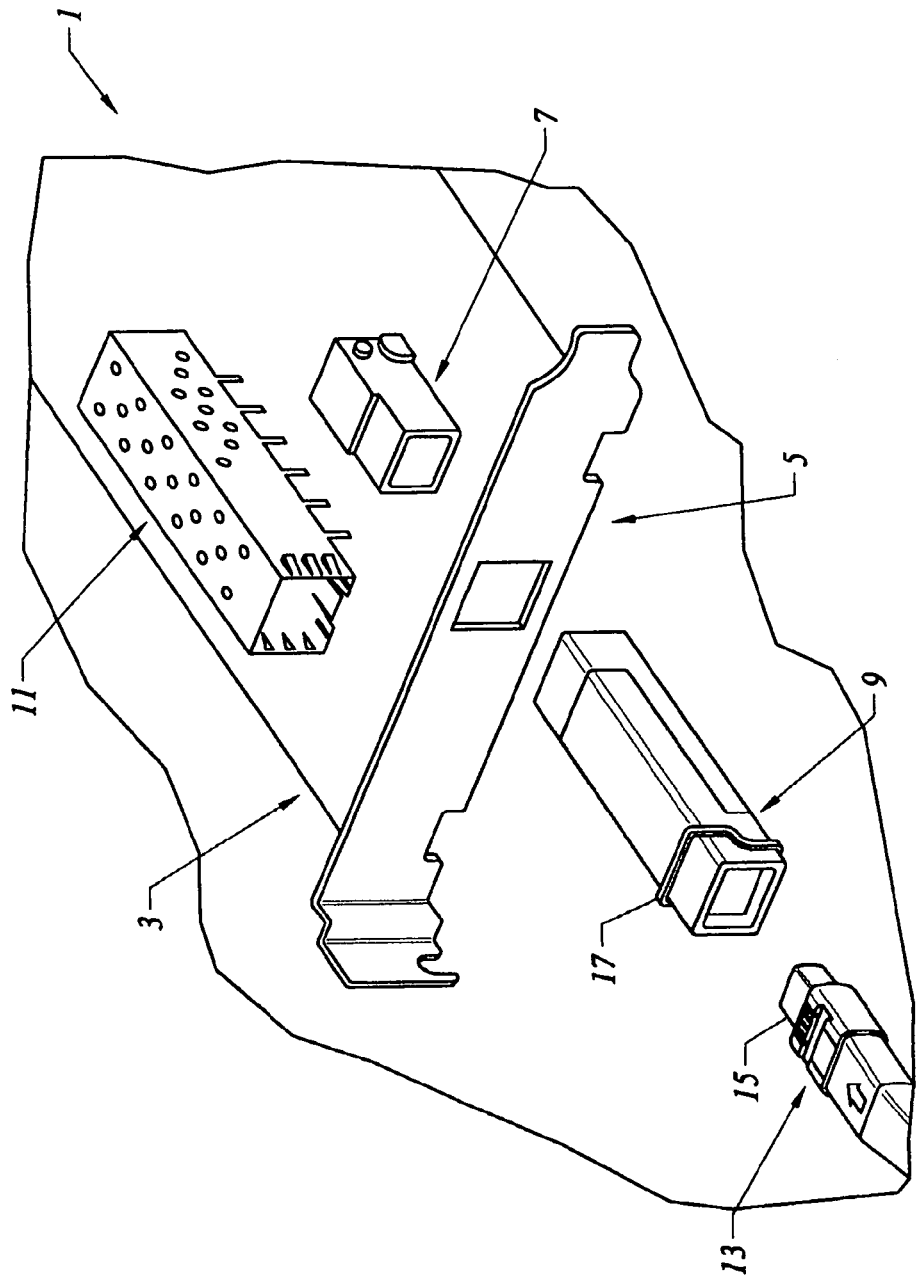
FIG. 1 shows an example of a parallel optical transceiver that is pluggable into a line card.

FIG. 1 shows an example of a multiple channel optical transceiver that is pluggable into a line card. A line card 1 is inserted into a network device such as a switch, router, cross-connect, and the like. Line card 1 includes a motherboard 3 including electrical components/connections (not shown) and a bezel 5. A connector 7 is mounted on motherboard 3 in order to electrically couple an optical transceiver module 9 to electrical components on the motherboard.

Optical transceiver module 9 is pluggable into connector 7. A cage assembly 11 is mounted on motherboard 3 to protect and retain optical transceiver module 9 once it is inserted into connector 7. As shown, connector 7 has two slots and associated rows of pins for accepting parallel electronic boards that are housed with the optical transceiver module. Connector 7 can be a single two-row connector or two single-row connectors on above the other. An internal configuration of optical transceiver module 9 will be discussed in more detail in reference to FIG. 3.

A plug 13 can be inserted into optical transceiver module 9. For example, the plug can be an MTP or MPO plug. Plug 13 includes a ferrule 15 that retains and aligns the multiple optical fibers in the cable. As shown, optical transceiver module 9 can include a latch 17 to assist in retaining plug 13 in transceiver module 9 when inserted therein. Other types of plugs and retention mechanisms can be utilized with other embodiments.

Figure 2A:
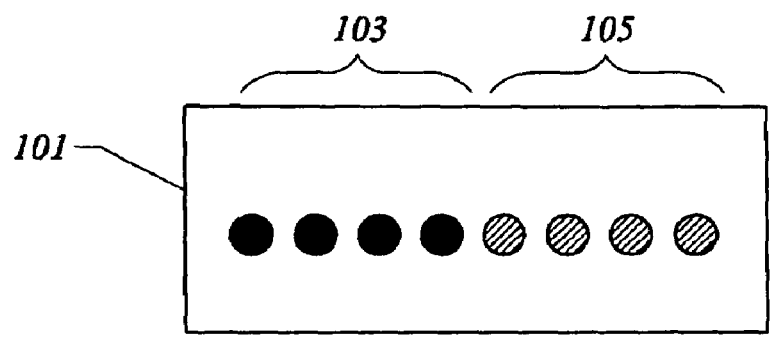
FIGS. 2A and 2B show conventional ferrule patterns that include transmitting and receiving optical fibers.
Figure 2B:
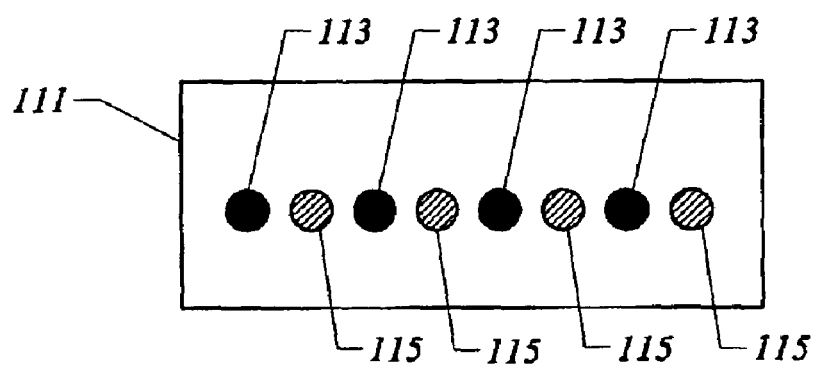

The ferrules retain optical fibers so they can interface with corresponding optical emitters and optical detectors. FIGS. 2A and 2B show conventional ferrule patterns that include transmitting and receiving optical fibers.

In FIG. 2A, a ferrule 101 retains eight optical fibers. Typically, the spacing of the optical fibers in this arrangement is every 125 microns. Four of the optical fibers 103 transmit to the optical transceiver module and four of the optical fibers 105 receive optical transmissions from the optical transceiver. In this configuration, optical fibers that are similar are grouped together.

FIG. 2B shows a different ferrule pattern. A ferrule 111 includes four optical fibers 113 that transmit to the optical transceiver module alternating with four optical fibers 115 that receive optical transmissions from the optical transceiver. In this configuration, transmitting and receiving optical fibers are alternated.

Optical emitters and detectors are disposed within the optical transceiver module to align with the optical fibers in the ferrule. For example, a bar that includes both laser diodes and detectors may need to be manufactured for the ferrule patterns of FIGS. 2A and 2B.

Figure 2C:
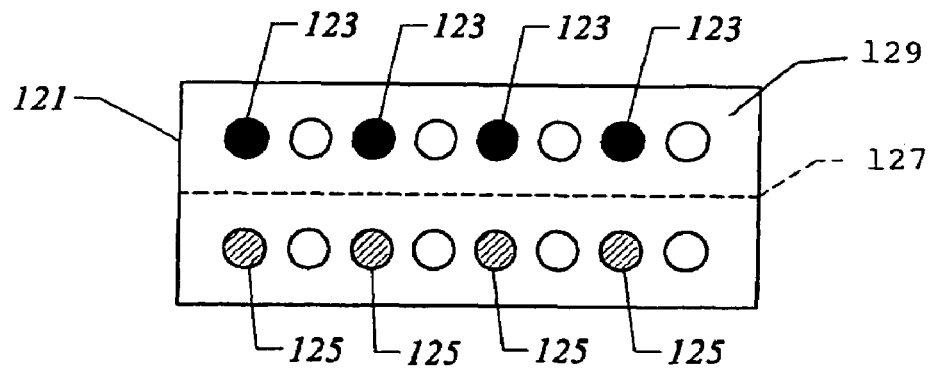
FIG. 2C shows a ferrule pattern of one embodiment of the invention for interfacing with a row of four optical emitters and a row of four optical detectors.

A problem results in that laser diodes and detectors are generally incompatible, which makes hybrid bars difficult to manufacture and resulting low yields. Additionally, the spacing between transmitting and receiving optical fibers can be fairly close (e.g., 125 microns), which can increase optical crosstalk. FIG. 2C shows a ferrule pattern of one embodiment of the invention for interfacing with a row of four optical emitters and a row of four optical detectors.

A dual row ferrule 121 retains eight optical fibers. A row of four optical fibers 123 that transmit to the optical transceiver module are disposed parallel to a row of four optical fibers 125 that receive optical transmissions from the optical transceiver. As indicated by a dashed line 127, a bar of laser diodes can be manufactured for one half and a bar of laser detectors can be manufactured for the other half. Thus, manufacturing a hybrid bar is not required.

Furthermore, the additional spacing between the laser diodes and detectors results in reduced optical crosstalk. For example, because the fabrication of every other laser diode or detector 129 can be skipped, the spacing can be 250 microns between adjacent laser diodes and detectors (i.e., both within a row and row-to-row). Additionally, this configuration creates multiple transmit/receive pairs, which makes transitions to duplex fiber cable much easier.

Conventional equipment and settings can be utilized to manufacture these bars. As an example, the equipment for manufacturing bars for FIGS. 2A and 2B can be utilized to make the separate bars. When done in this manner, the fabrication of laser diodes and detectors 129 can be skipped to save costs. Alternatively, laser diodes and detectors 129 can be manufactured on the bars, but not utilized.

Figure 2D:
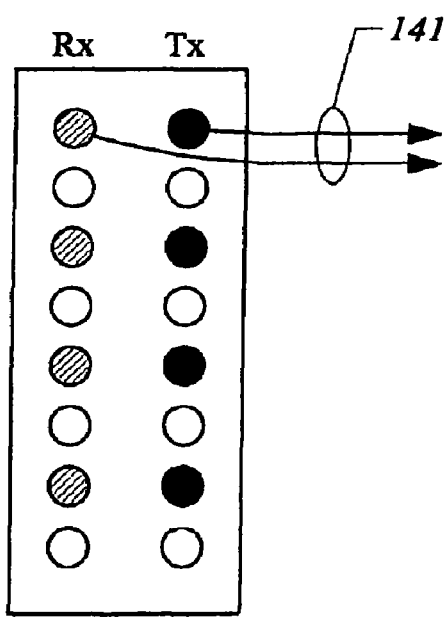
FIG. 2D shows how the optical fibers from the ferrule pattern in FIG. 2C can be dressed out as one or more fiber pairs.

FIG. 2D shows how the optical fibers from the ferrule pattern in FIG. 2C can be dressed out as one or more fiber pairs. As shown, a pair 141 includes a transmitting optical fiber and a receiving optical fiber. In some embodiments, four pairs are supported. Each pair can be a line cord pair (e.g., similar to speaker wire) where a user can separate the individual lines as the desired. By allowing the transmit and receive optical fibers to go to different locations, daisy-chained connections can be easily supported. Parallel ribbon fiber optic cables require all ports to go to a same port and requires receiving and transmitting optical fibers to go to the same transceiver, which prevents daisy-chaining. Conventional techniques such as the use of two breakout cables, couplers and cables also do not provide the flexibility provided by embodiments of the invention.

In other embodiments, the optical fibers are dressed out in single lines (e.g., eight single lines). In still other embodiments, mixed pairs and single lines can be present. Thus, the optical fibers can be dressed out in different configurations depending on the application (see also FIG. 6).

Figure 3:
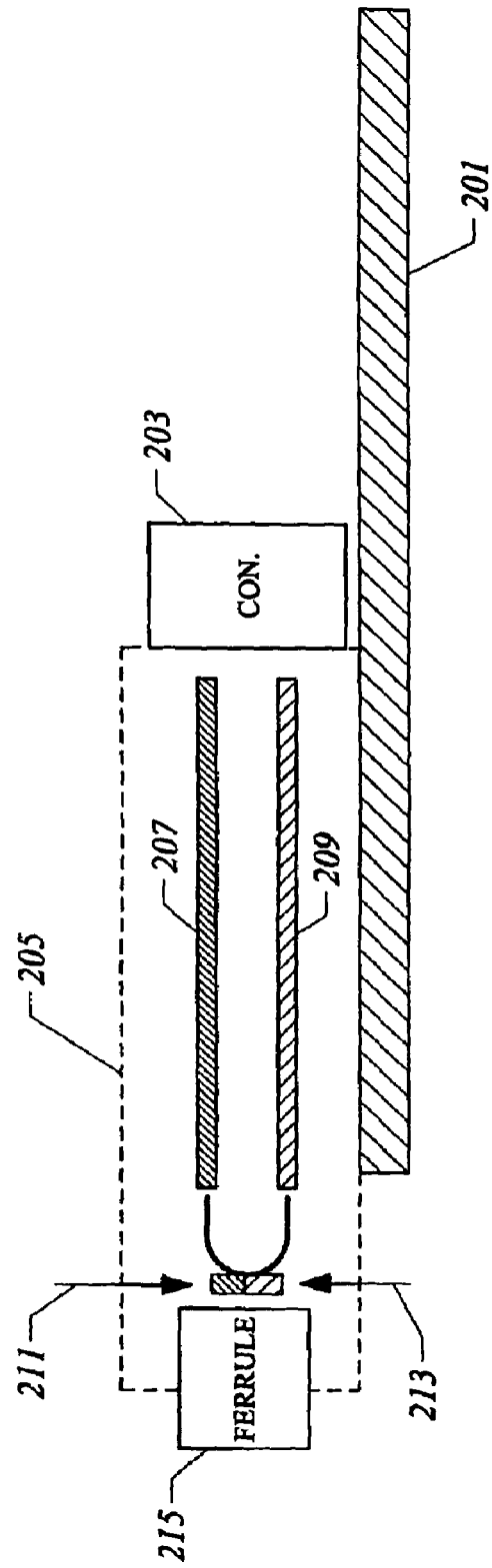
FIG. 3 illustrates an embodiment of the invention including transmit and receive bars and separate electronic boards for transmitting and receiving.

Now the description will turn to further specifics of the optical transceiver module. FIG. 3 illustrates a optical transceiver module including transmit and receive bars and separate electronic boards for transmitting and receiving. A motherboard 201 has a connector 203 mounted thereon. Connector 203 has two slots and associated rows of pins for accepting parallel electronic boards that are housed within an optical transceiver module 205 (the dashed lines represent the outline of the module so that internal components can be seen).

Within optical transceiver module 205 is a transmitting electronic board 207 and a receiving electronic board 209. Each board has the electrical circuitry and components to perform the associated tasks. The boards have edge connectors that provide the electrical connection to the motherboard via connector 203 when inserted in the twin slots of the connector.

Flexible electrical connections couple transmitting electronic board 207 to a transmitting bar 211, which can have a row of laser diodes or LEDs (see, e.g., FIG. 2C). Similarly, flexible electrical connections couple receiving electronic board 209 to a receiving bar 213, which can have a row of laser detectors. A ferrule (e.g., MTP ferrule) 215 is a part of the cable plug and retains optical fibers so they can optically couple to transmitting bar 211 and receiving bar 213.

Electrical crosstalk within optical transceiver module 205 is reduced or eliminated because the transmitting and receiving electronics are on separate, parallel boards as shown. Conventional optical transceivers modules include an electronic board with both transmitting and receiving circuitry/components, which facilitates electrical crosstalk.

Figure 4:
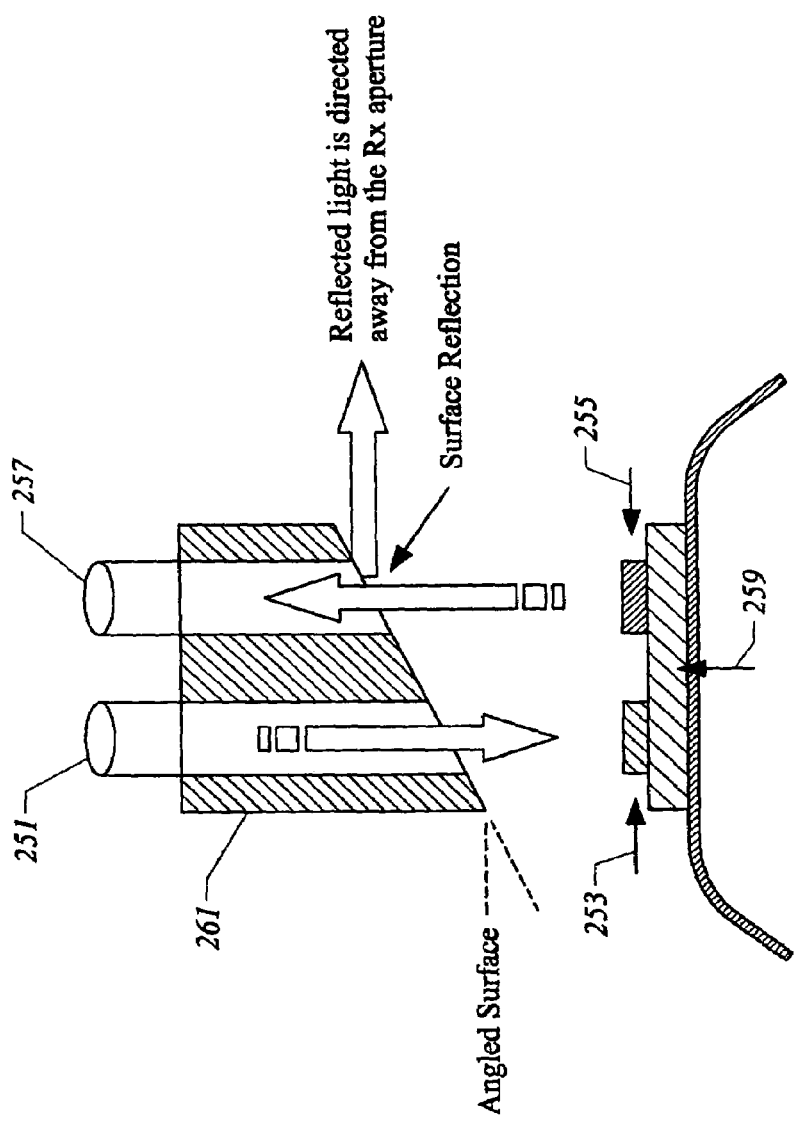
FIG. 4 shows the dual row orientation taking advantage of an angled surface on the ferrule to reduce optical crosstalk in the transceiver.

FIG. 4 shows how the dual row orientation in some embodiments can take advantage of an angled surface on the ferrule to reduce optical crosstalk in the transceiver. A receiving optical fiber 251 delivers light to receiving bar 253. Similarly, light from transmitting bar 255 is delivered to transmitting optical fiber 257. As shown receiving bar 253 and transmitting bar 255 are on a substrate 259 that communicates to the electronic boards through flexible electrical connections.

A ferrule 261 retains the optical fibers and is angled at the end proximal to receiving and transmitting bars 253 and 255, respectively. The orientation of the receiving and transmitting bars to the angle of the ferrule is designed so that light reflected at the aperture of transmitting optical fiber 257 is directed away from the aperture of receiving optical fiber 251. Thus, optical crosstalk can be reduced by the specific orientation of the optical emitters and detectors relative to the angled end on ferrule 261.

Figure 5A:
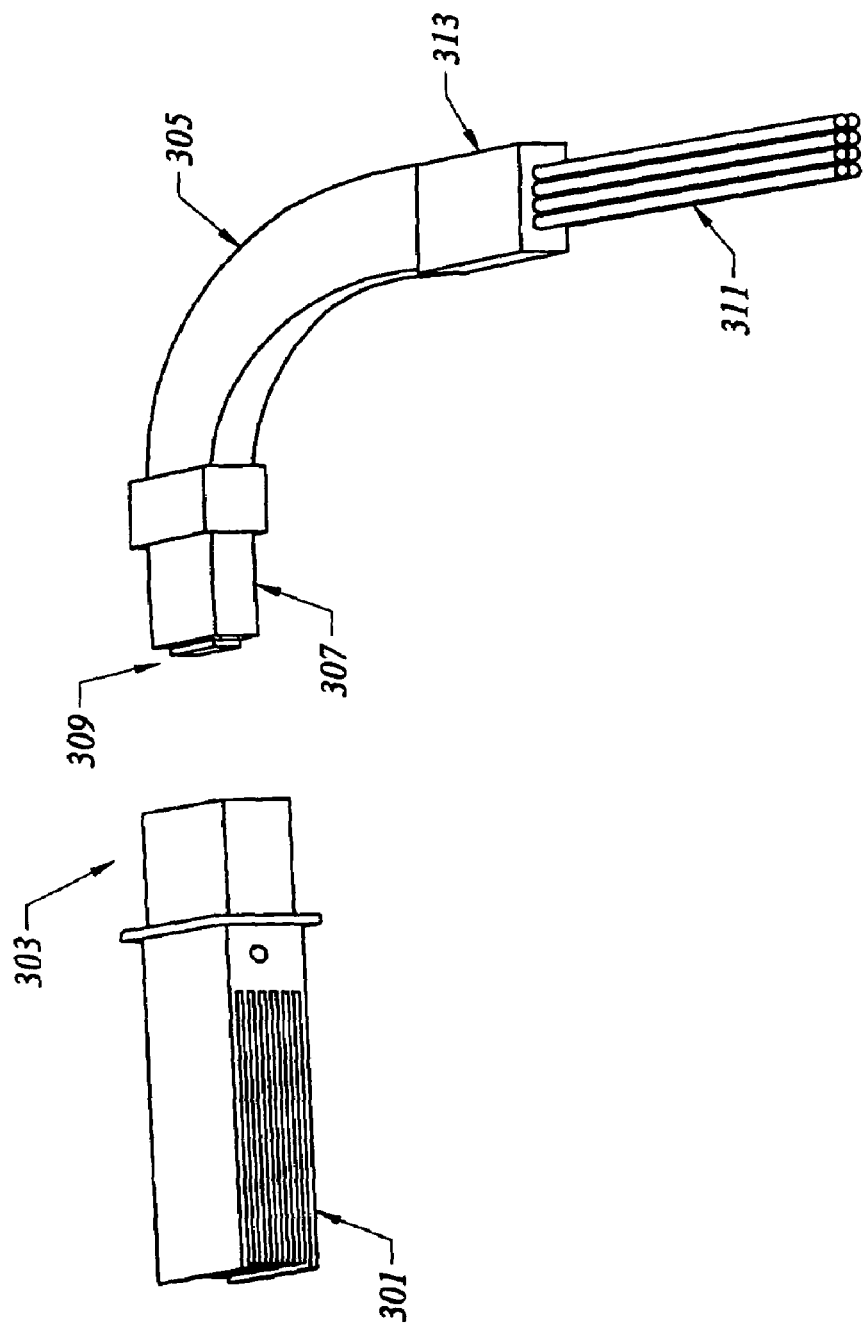
Figure 5B:
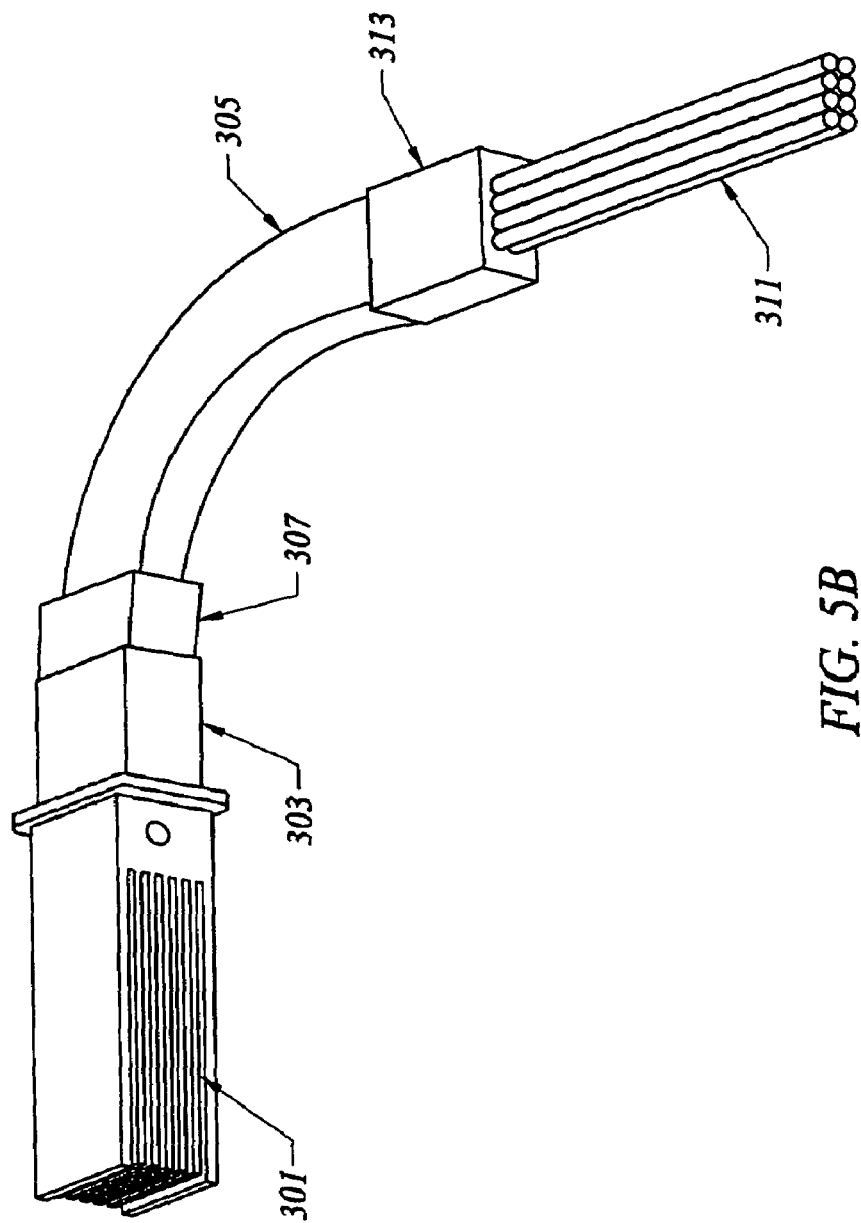

FIGS. 5A and 5B show an example of a cable that can be connected to a parallel optical transceiver of the invention. With regard to FIG. 5A, an optical transceiver module 301 includes an adapter 303 at one end for receiving the end of a cable housing 305. Cable housing 305 includes a dense face mountable interconnect 307 for connecting to adaptor 303.

A ferrule 309 retains the optical fibers for optical coupling to optical emitters and detectors in optical transceiver module 301. As shown, cable housing 305 has a 90 degree bend, which may be desirable for routing the cables. Eight cables 311 are shown extending out of furcation block 313. These cables can be dressed out as four independent duplex cables for connection to line cards in other network devices. In other embodiments, there can be fewer or more cables, the cables can be dressed out as pairs or as single cables, or any combination depending on the application.

FIG. 5B shows dense face mountable interconnect 307 of cable housing 305 inserted into optical transceiver module 301. These figures illustrate one way of connecting the optical transceiver module to the optical fibers in the cables, but other techniques may be advantageously utilized with the invention.

Figure 6:
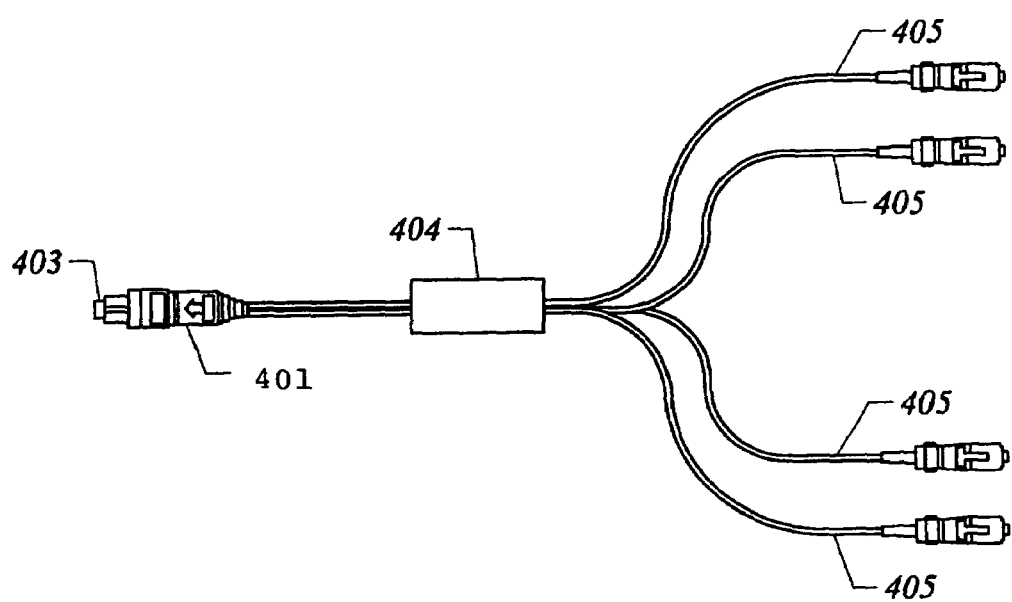
FIG. 6 illustrates another example of a cable that can be utilized with embodiments of the invention.

For example, in one embodiment, a MTO or MTP plug is utilized that fans out into four duplex cables. FIG. 6 illustrates an example of this cable. A plug 401 houses a ferrule 403 that retains the optical fibers. The parallel cable of optical fibers are separated out into individual optical fibers by a furcation block 404. The furcation block can provide buffering and strain-relief in addition to routing the optical fibers into standard "yellow jacket" cabling. There are eight optical fibers that are dressed out into four duplex cables 405 as shown. As mentioned previously, the optical fibers may be dressed out as eight single cables or many other configurations.

While the above is a complete description of preferred embodiments of the invention, various alternatives, modifications, and equivalents can be used. It should be evident that the invention is equally applicable by making appropriate modifications to the embodiments described above. For example, although the invention has been described in relation to specific embodiments, the invention can be advantageously applied to other embodiments. Therefore, the above description should not be taken as limiting the scope of the invention as defined by the metes and bounds of the appended claims along with their full scope of equivalents

The invention claimed is:

1. An optical transceiver module, comprising:
a row of a plurality of optical emitters; and
a row of a plurality of optical detectors, wherein the row of optical emitters is parallel to the row of optical detectors;
wherein each of the optical emitters and detectors corresponds to an optical fiber retained in a ferrule of a cable and the orientation of the row of optical emitters and the row of optical detectors is such that light reflected at an angled surface of the ferrule at an aperture of an optical fiber corresponding to an optical emitter is directed away from an aperture of an optical fiber corresponding to an optical detector, the aperture of the optical fiber corresponding to the optical emitter and the aperture of the optical fiber corresponding to the optical detector located at the same angled surface of the ferrule.

2. The optical transceiver module of claim 1, further comprising a transmitting electronic board electrically coupled to the row of optical emitters for controlling the optical emitters.

3. The optical transceiver module of claim 2, further comprising a receiving electronic board electrically coupled to the row of optical detectors for receiving electrical signals from the optical detectors.

4. The optical transceiver module of claim 3, wherein the transmitting electronic board and receiving electronic board are parallel and separate from one another.

5. The optical transceiver module of claim 3, wherein the optical transceiver module is adapted to being inserted in a connector on a line card, wherein the connector has two rows of pins for electrically coupling with the transmitting and receiving electronic boards.

6. The optical transceiver module of claim 1, wherein the optical emitters are laser diodes or LEDs.

7. The optical transceiver module of claim 1, wherein the optical detectors are laser detectors.

8. The optical transceiver module of claim 1, wherein the row of optical emitters comprises four laser diodes.

9. The optical transceiver module of claim 1, wherein the row of optical detectors comprises four laser detectors.

10. The optical transceiver module of claim 1 wherein spacing between adjacent laser diodes and detectors is approximately 250 microns.

11. The optical transceiver module of claim 1 wherein said light reflected at the angled surface of the ferrule is directed away from the aperture of the optical fiber corresponding to the optical detector at a direction generally perpendicular to a path of the optical fiber corresponding to the optical detector.

12. The optical transceiver module of claim 1 wherein the angled surface is positioned adjacent to the optical emitter and the optical detector.

13. An optical transceiver module, comprising:
a row of four optical emitters; and
a row of four optical detectors, wherein the row of optical emitters is parallel to the row of optical detectors;
wherein each of the optical emitters and detectors corresponds to an optical fiber retained in a ferrule of a cable and the orientation of the row of optical emitters and the row of optical detectors is such that light reflected at an angled surface of the ferrule at an aperture of an optical fiber corresponding to an optical emitter is directed away from an aperture of an optical fiber corresponding to an optical detector, the aperture of the optical fiber corresponding to the optical emitter and the aperture of the optical fiber corresponding to the optical detector located at the same angled surface of the ferrule.

14. The optical transceiver module of claim 13, further comprising a transmitting electronic board electrically coupled to the row of optical emitters for controlling the optical emitters.

15. The optical transceiver module of claim 14, further comprising a receiving electronic board electrically coupled to the row of optical detectors for receiving electrical signals from the optical detectors.

16. The optical transceiver module of claim 15, wherein the transmitting electronic board and receiving electronic board are parallel and separate from one another.

17. The optical transceiver module of claim 13, wherein the optical transceiver module is adapted to being inserted in a connector on a line card, wherein the connector has two rows of pins for electrically coupling with the transmitting and receiving electronic boards.

18. The optical transceiver module of claim 13, wherein the optical emitters are laser diodes or LEDs.

19. The optical transceiver module of claim 13, wherein the optical detectors are laser detectors.

20. An optical transceiver module, comprising:
a transmitting electronic board electrically coupled to an optical emitter for controlling the optical emitter; and
a receiving electronic board electrically coupled to an optical detector for receiving electrical signals from the optical detectors;
wherein the each of the optical emitters and detectors corresponds to an optical fiber retained in a ferrule of a cable and the orientation of the row of optical emitters and the row of optical detectors is such that light reflected an at angled surface of the ferrule at an aperture of an optical fiber corresponding to an optical emitter is directed away from an aperture of an optical fiber corresponding to an optical detector, the aperture of the optical fiber corresponding to the optical emitter and the aperture of the optical fiber corresponding to the optical detector located at the same angled surface of the ferrule.

21. The optical transceiver module of claim 20, wherein the transmitting electronic board and receiving electronic board are parallel and separate from one another.

22. The optical transceiver module of claim 20, wherein the optical transceiver module is adapted to being inserted in a connector on a line card, wherein the connector has two rows of pins for electrically coupling with the transmitting and receiving electronic boards.

23. The optical transceiver module of claim 20, wherein the transmitting electronic board is electrically coupled to a row of a plurality of optical emitters and the detecting electronic board is electrically coupled to a row of a plurality of optical detectors, wherein the row of optical emitters is parallel to the row of optical detectors.

24. The optical transceiver module of claim 20, wherein the optical emitters are laser diodes or LEDs.

25. The optical transceiver module of claim 20, wherein the optical detectors are laser detectors.

26. An optical transceiver module, comprising:
a row of four optical emitters;
a transmitting electronic board electrically coupled to the row of optical emitters for controlling the optical emitters;
a row of four optical detectors, wherein the row of optical emitters is parallel to the row of optical detectors; and
a receiving electronic board electrically coupled to the row of optical detectors for receiving electrical signals from the optical detectors;
wherein each of the optical emitters and detectors corresponds to an optical fiber retained in a ferrule of a cable and the orientation of the row of optical emitters and the row of optical detectors is such that light reflected at an angled surface of the ferrule at an aperture of an optical fiber corresponding to an optical emitter is directed away from an aperture of an optical fiber corresponding to an optical detector, the aperture of the optical fiber corresponding to the optical emitter and the aperture of the optical fiber corresponding to the optical detector located at the same angled surface of the ferrule.

27. The optical transceiver module of claim 26, wherein the transmitting electronic board and receiving electronic board are parallel and separate from one another.

28. The optical transceiver module of claim 26, wherein the optical transceiver module is adapted to being inserted in a connector on a line card, wherein the connector has two rows of pins for electrically coupling with the transmitting and receiving electronic boards.

29. The optical transceiver module of claim 26, wherein the optical emitters are laser diodes or LEDs.

30. The optical transceiver module of claim 26, wherein the optical detectors are laser detectors.

* * * * *